United States Patent [19]

Einzinger et al.

[11] Patent Number: 4,728,826
[45] Date of Patent: Mar. 1, 1988

[54] MOSFET SWITCH WITH INDUCTIVE LOAD

[75] Inventors: Josef Einzinger, Unterschleissheim; Christine Fellinger, Unterhaching; Ludwig Leipold, Munich; Jenoe Tihanyi, Munich; Roland Weber, Munich, all of Fed. Rep. of Germany

[73] Assignee: Siemens Aktiengesellschaft, Berlin and Munich, Fed. Rep. of Germany

[21] Appl. No.: 886,576

[22] Filed: Jul. 16, 1986

[30] Foreign Application Priority Data

Mar. 19, 1986 [DE] Fed. Rep. of Germany ....... 3609235

[51] Int. Cl.$^4$ .................... H03K 17/04; H03K 17/687
[52] U.S. Cl. ...................................... 307/571; 307/542; 307/584; 307/549
[58] Field of Search ............... 307/570, 571, 572, 270, 307/246, 575, 577, 581, 584, 318, 300, 566, 280, 542, 544, 548, 568, 549

[56] References Cited

U.S. PATENT DOCUMENTS

| | | | |
|---|---|---|---|
| 3,740,581 | 6/1973 | Pfiffner | 307/570 |
| 3,848,108 | 11/1974 | Takarada | 307/570 |
| 3,896,367 | 7/1975 | Frantz | 307/570 |
| 4,020,365 | 4/1977 | Weir | 307/571 |
| 4,313,065 | 1/1982 | Yoshida et al. | 307/570 |
| 4,492,883 | 1/1985 | Janutka | 307/571 |

FOREIGN PATENT DOCUMENTS 3405936 2/1984 Fed. Rep. of Germany .
60-11324 6/1985 Japan .

OTHER PUBLICATIONS

Instruments and Experimental Techniques, vol. 27, No. 5, Part 1, Sep./Oct. 1984, pp. 1159–1161, Plenum Pub. Corp., NY, USA; V. V. Bachurin et al.: "Heavy-Current Nanosecond Pulse Shapers Using High-Power MOS Transistors with a Vertical Channel".
Nachrichtentechnik GmbH, p. 5, last col.-p. 6, col. 2; FIG. 1.
New Electronics, vol. 18, No. 11, May 28, 1985, pp. 44, 46 London, Alexander et al, "Designing Improved High Speed Gate Drive Circuit".

Primary Examiner—Stanley D. Miller
Assistant Examiner—Timothy P. Callahan
Attorney, Agent, or Firm—Lawrence C. Edelman

[57] ABSTRACT

The voltage peaks occuring upon disconnection of inductive loads are normally attenuated by a by-pass diode connected in parallel with the load. The driving countervoltage is thereby limited to the value of the forward voltage drop of the diode. For a power MOSFET with a source-side inductive load, the driving countervoltage is increased by placing a series connection of an additional MOSFET and a Zener diode between the gate of the power MOSFET and the connection of the load which is remote from the power MOSFET. The driving countervoltage at the source now becomes the Zener voltage plus the occuring gate-source voltage of the power MOSFET.

5 Claims, 2 Drawing Figures

MOSFET SWITCH WITH INDUCTIVE LOAD

BACKGROUND OF THE INVENTION

1. Field of the Invention

The invention relates to a circuit arrangement including a power MOSFET having an inductive load which lies between the source of the power MOSFET and a first terminal, and the drain of the power MOSFET connected to a second terminal.

2. Background of the Invention

Such a circuit arrangement has been described, for example, in the German journal "Electronic Industrie", 4-1985, pages 32 to 38. FIG. 1 of the present application illustrates a simplified representation of this prior art circuit arrangement. The problem of limiting the negative, voltage peak occurring upon disconnection of an inductive load is solved therein in the generally customary manner by connecting a diode Di in parallel with the inductive load L, the parallel combination being connected in series with the power MOSFET T 1 on the source side. Thus, the negative voltage peak occurring upon disconnection is limited to the forward voltage drop of the diode, but the energy stored in load L is reduce only very slowly due to the low value of the driving countervoltage.

SUMMARY OF INVENTORY

It is an object of the invention to develop a circuit arrangement of the above mentioned kind in which the driving countervoltage can be adjusted to a higher value and can be limited to a value harmless for the power MOSFET.

In accordance with the invention, this problem is solved by inserting a series connection of a switch and a Zener diode between the gate of the power MOSFET and the first terminal, the Zener diode being poled so that it forms with the switch and the inductive load a discharge circuit for the gate-source capacitance of the power MOSFET.

Other features and advantages of the invention will be apparent from the following description of the preferred embodiment, and from the claims.

For a fuller understanding of the present invention, reference should now be made to the following detailed description of a preferred embodiment of the invention and to the accompanying drawing.

DETAILED DESCRIPTION OF THE DRAWINGS

Figure 1:
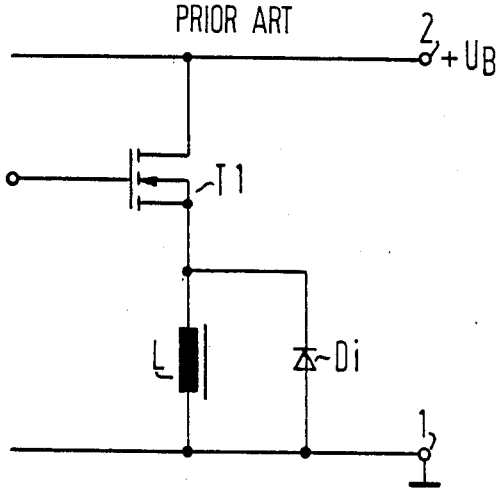
FIG. 1 illustrates the previously described prior art MOSFET switch with inductive load.
Figure 2:
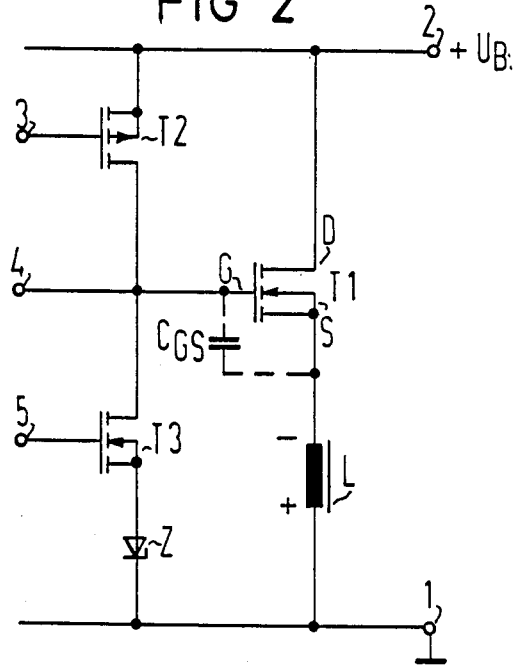
FIG. 2 illustrates a MOSFET switch arrangement with inductive load, constructed in accordance with the principles of the invention.

The circuit arrangement of the invention illustrated in FIG. 2 comprises a power MOSFET T 1, having an inductive load L connected in series on its source side. The inductive load connection remote from the source connection of T 1 is connected to a first terminal 1. The drain connection D of T 1 is connected to a second terminal 2. Terminal 1 is, for example, at ground potential and an opening voltage $+U_B$ is applied between terminals 1 and 2. A series connection of a switch T 3 and a Zener diode Z is connected between the gate G of MOSFET T 1 and the first terminal 1. Switch T 3 is preferably an MOSFET of the same channel type as MOSFET T 1. Zener diode Z is poled so that the gate-source capacitance $C_{GS}$ of MOSFET T 1 can discharge via MOSFET T 3, Zener diode Z, and inductive load L. The discharge current of $C_{GS}$ therefore flows through the Zener diode Z in the flow direction.

To explain the operation, the conducting state of power MOSFET T1 is taken as the point of departure. Then there is present at an input terminal 4 a voltage which is higher than the operating voltage $+U_B$. The source potential of T 1 lies somewhat below $+U_B$. A current flows from terminal 2 to terminal 1. If MOSFET T 1 is to be disconnected, the voltage at its input terminal 4 is made to be zero and MOSFET T 3 is switched on by application of a voltage which is positive against ground to its input terminal 5. Then the gate-source capacitance $C_{GS}$ of MOSFET T 1 can discharge and MOSFET T 1 begins to block. By developing a negative voltage at the source S of MOSFET T 1, the inductive load L counteracts the decreasing current. Thus load L acts as current source and at first maintains the current flow via terminal 1, the operating voltage source, terminal 2, and MOSFET T 1. The negative voltage occuring at source S brings about, via the capacitive coupling, also a negative voltage at gate G. If this voltage reaches the threshold voltage of Zener diode Z, e.g. $-6$ V, it conducts. Thereby the potential at gate G is limited to the Zener voltage minus the forward voltage drops across MOSFET T 3. This means that the negative voltage at source S is limited to the gate potential plus the gate-source voltage of MOSFET T 1. If this voltage is e.g. 3 V, then the maximum voltage at source S is approximately $-9$ V against ground. This voltage is harmless for MOSFET T 1 in the corresponding voltage class. In addition, the countervoltage driving the energy reduction in load L is very much greater than in the prior art solutions. The switch can therefore be operated at comparatively high frequencies of e.g. 150 HZ at an inductive load of 15 mH.

The voltage at terminal 4 which switches power MOSFET T 1 ON can be generated for example by a voltage doubling circuit as described for example in the journal "Siemens Components", 4/84, pages 169 to 170 published by Siemens AG Hellabrunner Strasse 1, D-8000 Muenchen 90, Federal Republic of Germany. Thereby a higher voltage than $+U_B$ can be obtained from the operating voltage $+U_B$ be stepwise charging of a capacitor. The switching-on process can be accelerated by connecting between gate G of MOSFET T 1 and terminal 2 an additional MOSFET T 2 which is of the opposite channel type of MOSFET T 1. If MOSFET T 2 is switched ON by a signal at its input terminal 3, the capacitance $C_{GS}$ and the above mentioned stepwise charging capacitor charge quickly to the operating voltage, so that said charging capacitor needs to be further charged only by the voltage needed for good switching-through of MOSFET T 1, e.g. 7 V.

Thus, there has been show and described novel MOSFET switch apparatus for an inductive load which fulfills all the objects and advantages sought therefore. Many changes, modifications, variations and other uses and applications of the subject invention will, however, become apparent to those skilled in the art after considering this specification and the accompanying drawing which discloses a preferred embodiment thereof. For example, although the invention has been described with reference to a circuit arrangement operated at a positive voltage, the circuit arrangement could also be operated betCween ground and a negative voltage using MOSFETs of opposite channel type. In this case the polarity of the Zener diode must be reversed accordingly. All such changes, modifications, variations and other uses and applications which do not depart from the spirit and scope of the invention are deemed to be covered by the invention which is limited only by the claims which follow.

What is claimed is:

1. A circuit arrangement for aiding the turn-off of a power MOSFET having an inductive load which is connected between the source of the power MOSFET and a first terminal, and having a second terminal which is connected to the drain of the power MOSFET, comprising:

a series connection of a switch and a Zener diode connected between the gate of the power MOSFET and the first terminal, said Zener diode being poled for conduction in its reverse breakdown region so that in combination with conduction of the switch during turn-off of said power MOSFET, the reverse breakdown voltage of said Zener diode limits the voltage at said gate and source of the power MOSFET, thereby aiding energy reduction of said inductor during said turn-off of said power MOSFET and additionally forming a discharge circuit for the gate-source capacitance of the power MOSFET.

2. A circuit arrangement according to claim 1, wherein:

said switch is a MOSFET of the same channel type as said power MOSFET.

3. A circuit arrangement according to claim 1, including:

an additional switch connected between the gate of said power MOSFET and said second terminal.

4. A circuit arrangement according to claim 2, including:

an additional switch connected between the gate of said power MOSFET and said second terminal.

5. A circuit arrangement according to claim 3, wherein said the additional switch is a MOSFET of a channel type opposite to that of said power MOSFET.

* * * * *